United States Patent
Chu et al.

(10) Patent No.: US 9,812,532 B1
(45) Date of Patent: Nov. 7, 2017

(54) III-NITRIDE P-CHANNEL TRANSISTOR

(71) Applicant: HRL Laboratories, LLC, Malibu, CA (US)

(72) Inventors: Rongming Chu, Agoura Hills, CA (US); Yu Cao, Agoura Hills, CA (US); Mary Y. Chen, Oak Park, CA (US); Zijian "Ray" Li, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/838,958

(22) Filed: Aug. 28, 2015

(51) Int. Cl.
  *H01L 29/15* (2006.01)
  *H01L 29/20* (2006.01)
  *H01L 29/66* (2006.01)
  *H01L 29/78* (2006.01)
  *H01L 29/207* (2006.01)

(52) U.S. Cl.
  CPC ........ *H01L 29/2003* (2013.01); *H01L 29/207* (2013.01); *H01L 29/66666* (2013.01); *H01L 29/7827* (2013.01)

(58) Field of Classification Search
  CPC ............. H01L 29/2003; H01L 29/7827; H01L 29/66522; H01L 29/66462; H01L 29/513; H01L 29/4236; H01L 29/42376
  USPC ..................................................... 257/77–80
  See application file for complete search history.

(56) References Cited

U.S. PATENT DOCUMENTS

| | | | |
|---|---|---|---|
| 3,767,981 A | 10/1973 | Polata | |
| 5,661,318 A | 8/1997 | Nashimoto | |
| 6,215,152 B1 | 4/2001 | Hebert | |
| 6,423,645 B1 | 7/2002 | Wei et al. | |
| 7,045,404 B2 | 5/2006 | Sheppard et al. | |
| 7,304,331 B2 | 12/2007 | Saito et al. | |
| 7,555,219 B2 | 6/2009 | Cox et al. | |
| 7,573,078 B2 | 8/2009 | Wu et al. | |
| 7,622,763 B2 | 11/2009 | Suda et al. | |
| 7,671,383 B2 | 3/2010 | Hayashi et al. | |
| 7,728,355 B2 | 6/2010 | Beach et al. | |
| 7,800,132 B2 | 9/2010 | Smorchkova et al. | |
| 8,124,505 B1 | 2/2012 | Burnham et al. | |

(Continued)

FOREIGN PATENT DOCUMENTS

| | | |
|---|---|---|
| CN | 101180420 | 5/2008 |
| CN | 102184947 | 9/2011 |

(Continued)

OTHER PUBLICATIONS

From U.S. Appl. No. 14/290,029 (Unpublished, Non Publication Requested), Final Rejection mailed on Oct. 22, 2015.

(Continued)

*Primary Examiner* — Brook Kebede
(74) *Attorney, Agent, or Firm* — Ladas & Parry (57) ABSTRACT

A field effect transistor includes a III-Nitride channel layer, a III-Nitride doped cap layer on the channel layer, a source electrode in contact with the III-Nitride cap layer, a drain electrode in contact with the III-Nitride cap layer, a gate electrode located between the source and the drain electrodes, and a gate dielectric layer between the gate electrode and the III-Nitride undoped channel layer, wherein the cap layer is doped to provide mobile holes, and wherein the gate dielectric layer comprises a layer of AlN in contact with the channel layer.

24 Claims, 4 Drawing Sheets

(56) References Cited

U.S. PATENT DOCUMENTS

| | | |
|---|---|---|
| 8,169,005 B2 | 5/2012 | Wu et al. |
| 8,237,198 B2 | 8/2012 | Wu et al. |
| 8,530,978 B1 | 9/2013 | Chu et al. |
| 8,592,868 B2 | 11/2013 | Heikman et al. |
| 8,853,709 B2 | 10/2014 | Chu et al. |
| 8,872,233 B2 | 10/2014 | Lim et al. |
| 8,941,118 B1 | 1/2015 | Chu et al. |
| 9,024,357 B2 | 5/2015 | Puglisi et al. |
| 9,059,200 B1 | 6/2015 | Chu et al. |
| 9,337,332 B2 | 5/2016 | Chu et al. |
| 2001/0023964 A1 | 9/2001 | Wu et al. |
| 2003/0020092 A1 | 1/2003 | Parikh et al. |
| 2003/0151093 A1 | 8/2003 | Rumennik et al. |
| 2004/0061129 A1 | 4/2004 | Saxler et al. |
| 2005/0056893 A1 | 3/2005 | Hadizad |
| 2005/0098846 A1 | 5/2005 | Nagaoka |
| 2005/0285189 A1 | 12/2005 | Shibib et al. |
| 2006/0011915 A1 | 1/2006 | Saito et al. |
| 2006/0017064 A1 | 1/2006 | Saxler et al. |
| 2006/0060871 A1 | 3/2006 | Beach |
| 2006/0108606 A1 | 5/2006 | Saxler et al. |
| 2006/0194379 A1 | 8/2006 | Suda et al. |
| 2006/0249750 A1 | 11/2006 | Johnson et al. |
| 2007/0138551 A1 | 6/2007 | Ko |
| 2007/0141823 A1 | 6/2007 | Preble et al. |
| 2007/0164322 A1 | 7/2007 | Smith et al. |
| 2007/0164326 A1 | 7/2007 | Okamoto et al. |
| 2007/0194354 A1 | 8/2007 | Wu et al. |
| 2007/0210332 A1 | 9/2007 | Ueno et al. |
| 2007/0235775 A1 | 10/2007 | Wu et al. |
| 2008/0121895 A1 | 5/2008 | Sheppard et al. |
| 2008/0157121 A1* | 7/2008 | Ohki ............ H01L 29/7787 257/194 |
| 2008/0237605 A1 | 10/2008 | Murata et al. |
| 2008/0258243 A1* | 10/2008 | Kuroda ......... H01L 29/42376 257/410 |
| 2008/0261378 A1 | 10/2008 | Yao et al. |
| 2008/0290371 A1* | 11/2008 | Sheppard ......... H01L 21/046 257/192 |
| 2009/0008677 A1 | 1/2009 | Kikkawa |
| 2009/0042345 A1 | 2/2009 | Saxler et al. |
| 2009/0146186 A1 | 6/2009 | Kub et al. |
| 2009/0315078 A1 | 12/2009 | Parikh et al. |
| 2010/0025730 A1 | 2/2010 | Heikman et al. |
| 2010/0090251 A1 | 4/2010 | Lorenz et al. |
| 2010/0155780 A1 | 6/2010 | Machida et al. |
| 2010/0210080 A1* | 8/2010 | Nomura ........... H01L 29/2003 438/197 |
| 2011/0049526 A1 | 3/2011 | Chu et al. |
| 2011/0127604 A1 | 6/2011 | Sato |
| 2011/0133205 A1 | 6/2011 | Nagahisa et al. |
| 2011/0140172 A1 | 6/2011 | Chu et al. |
| 2011/0297958 A1 | 12/2011 | Kub et al. |
| 2012/0235160 A1 | 9/2012 | Heikman et al. |
| 2012/0261720 A1 | 10/2012 | Puglisi et al. |
| 2013/0001646 A1 | 1/2013 | Corrion et al. |
| 2013/0026495 A1* | 1/2013 | Chu ............... H01L 29/2003 257/77 |
| 2013/0092947 A1 | 4/2013 | Green et al. |
| 2013/0181224 A1 | 7/2013 | Lim et al. |
| 2013/0264578 A1* | 10/2013 | Mishra ............ H01L 29/205 257/76 |
| 2013/0306978 A1 | 11/2013 | Chen et al. |
| 2013/0313609 A1 | 11/2013 | Akutsu et al. |
| 2014/0092396 A1 | 4/2014 | Hopp |
| 2014/0159050 A1 | 6/2014 | Yoon et al. |
| 2014/0191288 A1 | 7/2014 | Kotani et al. |
| 2015/0048419 A1 | 2/2015 | Okamoto et al. |
| 2015/0060946 A1 | 3/2015 | Makiyama |

FOREIGN PATENT DOCUMENTS

| | | |
|---|---|---|
| CN | 101752430 | 6/2016 |
| JP | 2008/227501 | 9/2008 |
| JP | 2012/156164 | 8/2012 |
| JP | 2013/140835 | 7/2013 |
| WO | 2007/062589 | 6/2007 |

OTHER PUBLICATIONS

U.S. Appl. No. 14/290,029, filed May 29, 2014, Chu et al.

Ambacher, O. et al., "Two-Dimensional Electron Gases Induced by Spontaneous and Piezoelectric Polarization Charges in N- and Ga-face AlGaN/GaN Heterostructures," *Journal of Applied Physics*, vol. 85, No. 6, pp. 3222-3233, (Mar. 15, 1999).

Burnham, Shawn D. et al., "Gate-Recessed Normally-Off GaN-on-Si HEMT Using a New O2—BCl3 Digital Etching Technique," *Physica Status Solidi C 7, (ICNS-8)*, vol. 7, No. 7-8, pp. 2010-2012, (2010).

Buttari D. et al., "Digital Etching for Highly Reproducible Low Damage Gate Recessing on AlGaN/GaN HEMTs," *Proceedings, IEEE Lester Eastman Conference, High Performance Devices*, pp. 461-469, (Aug. 6-8, 2002).

Buttari D. et al., "Origin of Etch Delay Time in Cl2 Dry Etching of AlGaN/GaN Structures," *Applied Physics Letters*, vol. 83, No. 23, pp. 4779-4781, (Dec. 8, 2003).

Buttari D. et al., "Selective Dry Etching of GaN Over AlGaN in BCL3/SF6 Mixtures," *Proceedings, IEEE Lester Eastman Conference, High Performance Devices*, vol. 14, No. 3, pp. 132-137, (Aug. 2004).

Cai, Yong et al., "High-Performance Enhancement-Mode AlGaN/GaN HEMTs Using Fluoride-Based Plasma Treatment," *IEEE Electron Device Letters*, vol. 26, No. 7, pp. 435-437, (Jul. 2005).

Chen, T. et al., "AlGaN/GaN MIS HEMT with ALD Dielectric," *Digest of CS MANTECH Conference*, pp. 227-230, (Apr. 24-27, 2006).

DeSalvo, Gregory C. et al., "Wet Chemical Digital Etching of GaAs at Room Temperature," *Journal of the Electrochemical Society*, vol. 143, No. 11, pp. 3652-3656, (Nov. 1996).

Hahn et al., "p-Channel Enhancement and Depletion Mode GaN-Based HFETs with Quaternary Backbarriers," *IEEE Transaction on Electron Devices*, vol. 60, No. 10, pp. 3005-3011, (Oct. 2013).

Harris H. et al., "Plasma Enhanced Metalorganic Chemical Vapor Deposition of Amorphous Aluminum Nitrade,"*Journal of Applied Physics*, American Institute of Physics, vol. 90, No. 11, pp. 5825-5831, (Dec. 1, 2011).

Hashizume, T. et al., "Capacitance-Voltage Characterization of AlN/GaN Metal-Insulator-Semiconductor Structures Grown on Sapphire Substrate by Metalorganic Chemical Vapor Deposition," *Journal of Applied Physics*, vol. 88, No. 4, pp. 1983-1986, (Aug. 15, 2000).

Keogh, David et al., "Digital Etching of III-N. Materials Using a Two-Step Ar/KOH Technique," *Journal of Electronic Materials*, vol. 35, No. 4, pp. 771-776, (2006).

Khan, M. Asif et al., "Enhancement and Depletion Mode GaN/AlGaN Heterostructure Field Effect Transistors," *Applied Physics Letters*, vol. 68, No. 4, pp. 514-516, (Jan. 22, 1996).

Lanford, W. B. et al., "Recessed-gate enhancement-mode GaN HEMT with high threshold voltage," *Electronics Letters*, vol. 41, No. 7, pp. 449-450, (Mar. 31, 2005).

Li, G. et al., "Polarization-Induced GaN-on-Insulator E/D Mode p-Channel Heterostructure FETs," *IEEE Electron Device Letters*, vol. 34, No. 7, pp. 852-854, (Jul. 2013).

Ludviksson, Audunn et al., "Atomic Layer Etching Chemistry of Cl2 on GaAs(100)," *Surface Science*, vol. 277, pp. 282-300, (1992).

Maher, H. et al., "Smooth Wet Etching by Ultraviolet-Assisted Photoetching and Its Application to the Fabrication of AlGaN/GaN Heterostructure Field-Effect Transistors," *Applied Physics Letters*, vol. 77, No. 23, pp. 3833-3835, (Dec. 4, 2000).

Moon, Jeong S. et al., "Submicron Enhancement-mode AlGaN/GaN HEMTs," *Device Research Conference, 60th DRC. Conference Digest*, pp. 23-24, (2002).

Okamoto Y. et al., "179 W Recessed-Gate AlGaN/GaN Heterojunction FET with Field-Modulating Plate," *Electronics Letters*, vol. 40, No. 10, (May 13, 2004).

(56) References Cited

OTHER PUBLICATIONS

Parish, G. et al., "Simple Wet Etching of GaN," *Proceedings of SPIE, Device and Process Technologies for MEMS and Microelectronics II*, vol. 4592, pp. 104-110, (2001).
Shatalov, M. et al., "GaN/AlGaN p-Channel Inverted Heterostructure JFET," *IEEE Electron Device Letters*, vol. 23, No. 8, pp. 452-454, (Aug. 2002).
Zimmermann, T. et al., "P-Channel InGaN HFET Structure Based on Polarization Doping," *IEEE Electron Device Letters*, vol. 25, No. 7, pp. 450-452, (Jul. 2004).
EPO Extended Search Report with Search Opinion for European Patent Application No. 12819630.0 mailed on Mar. 6, 2015.
Chapter II International Preliminary Report on Patentability (IPRP) for PCT/US2012/043114 mailed on Jul. 3, 2013.
Chapter II International Preliminary Report on Patentability (IPRP) for PCT/US2013/062750 mailed on Aug. 25, 2015.
International Search Report and Written Opinion for PCT/US2012/043114 mailed on Dec. 26, 2012.
International Search Report and Written Opinion for PCT/US2013/062750 mailed on Jun. 26, 2014.
International Search Report and Written Opinion for PCT/US2014/055881 mailed on Dec. 22, 2014.
From U.S. Appl. No. 12/909,497 (Now U.S. Pat. No. 8,124,505), Non-Final Rejection mailed on May 31, 2011.
From U.S. Appl. No. 12/909,497 (Now U.S. Pat. No. 8,124,505), additional Non-Final Rejection mailed on May 31, 2011.
From U.S. Appl. No. 12/909,497 (Now U.S. Pat. No. 8,124,505), Notice of Allowance mailed on Oct. 24, 2011.
From U.S. Appl. No. 12/909,497 (Now U.S. Pat. No. 8,124,505), Notice of Allowance mailed on Nov. 10, 2011.
From U.S. Appl. No. 13/456,039 (Now U.S. Pat. No. 8,853,709), Rejection/Election mailed on Mar. 22, 2013.
From U.S. Appl. No. 13/456,039 (Now U.S. Pat. No. 8,853,709), Non-Final Rejection mailed on Apr. 3, 2013.
From U.S. Appl. No. 13/456,039 (Now U.S. Pat. No. 8,853,709), Final Rejection mailed on Jul. 12, 2013.
From U.S. Appl. No. 13/456,039 (Now U.S. Pat. No. 8,853,709), Advisory Action mailed on Sep. 6, 2013.
From U.S. Appl. No. 13/456,039 (Now U.S. Pat. No. 8,853,709), Non-Final Rejection mailed on Apr. 14, 2014.
From U.S. Appl. No. 13/456,039 (Now U.S. Pat. No. 8,853,709), Notice of Allowance mailed on Jun. 6, 2014.
From U.S. Appl. No. 13/456,039 (Now U.S. Pat. No. 8,853,709), Notice of Allowance mailed on Aug. 12, 2014.
From U.S. Appl. No. 14/041,667 (Now U.S. Pat. No. 8,941,118), Notice of Allowance mailed on Sep. 19, 2014.
From U.S. Appl. No. 14/290,029 (Unpublished, Non Publication Requested), Non-Final Rejection mailed on Apr. 24, 2015.
From U.S. Appl. No. 14/469,187 (Now U.S. Pat. No. 9,059,200), Non-Final Rejection mailed on Nov. 25, 2014.
From U.S. Appl. No. 14/469,187 (Now U.S. Pat. No. 9,059,200), Notice of Allowance mailed on Feb. 13, 2015.
From U.S. Appl. No. 14/469,187 (Now U.S. Pat. No. 9,059,200), Notice of Allowance mailed on May 11, 2015.
Chapter I, International Preliminary Report on Patentability (IPRP) from PCT Application No. PCT/US2014/055881 dated Apr. 5, 2016.
U.S. Appl. No. 15/354,406, filed Nov. 7, 2016, Chu.
Dora, A. Chakraborty, L. McCarthy, S. Keller, S. P. Denbaars, and U.K. Mishra, "High Breakdown Voltage Achieved on AlGaN/GaN HEMTs with Integrated Slant Field Plates", IEEE Electron Dev. Lett., vol. 27, No. 9, Sep. 2006.
Pei, Z. Chen, D. Brown, S. Keller, S. P. Denbaars, and U.K. Mishra, "Deep-Submicrometer AlGaN/GaN HEMTs With Slant Field Plates", IEEE Electron Dev. Lett., vol. 30, No. 4, Apr. 2009.
Xing, Y. Dora, A. Chini, S. Heikman, S. Keller, and U.k. Mishra, "High breakdown voltage AlGaN-GaN HEMTs Achieved by Multiple Field Plates," IEEE Electron Dev. Lett., vol. 25, No. 4, Apr. 2004.
From Chinese Application No. 2012800379093, Office Action dated Feb. 2, 2016 and its English translation provided by Chinese associate.
From Chinese Application No. 201280059254, Office Action dated Apr. 29, 2016 and its English translation provided by Chinese associate.
From PCT/US2012/038013, Chapter I, International Preliminary Report on Patentability (IPRP) dated Jun. 10, 2014.
From PCT/US2012/038013, PCT International Search Report and Written Opinion dated Feb. 21, 2013.
From U.S. Appl. No. 13/312,406 (now U.S. Pat. No. 8,530,978), Notice of Allowance dated Dec. 27, 2012.
From U.S. Appl. No. 13/312,406 (now U.S. Pat. No. 8,530,978), Notice of Allowance dated May 23, 2013.
From U.S. Appl. No. 14/290,029 (now U.S. Pat. No. 9,337,332), Notice of Allowance dated Jan. 14, 2016.
From Chinese Application No. 201380079683.8, Office Action dated Nov. 30, 2016 and its English translation provided by Chinese associate.
From U.S. Appl. No. 15/354,406 (unpublished, filed Nov. 7, 2016); Application and Office Actions.
From EPO Application No. 13894581.1, EPO Supplementary Search Report with Search Opinion dated Apr. 24, 2017.
From EPO Application No. 14847483.6, EPO Supplementary Search Report with Search Opinion dated Apr. 28, 2017.
Puneet Srivastava et al: "Silicon Substrate Engineered High-Voltage High-Temperature GaN-DHFETs". IEEE Transactions on Electron Devices, vol, 60, No. 7, Jul. 2013, pp. 2217-2223.

* cited by examiner

III-NITRIDE P-CHANNEL TRANSISTOR

CROSS REFERENCE TO RELATED APPLICATIONS

This application is related to U.S. patent application Ser. No. 13/456,039, filed Apr. 25, 2012, and to U.S. patent application Ser. No. 14/469,187, filed Aug. 26, 2014, which are incorporated herein as though set forth in full.

TECHNICAL FIELD

This disclosure relates to P-channel transistors, and in particular to normally off P-channel transistors.

BACKGROUND

P-channel FET transistors with a normally-off operation are needed to work in conjunction with N-channel transistors in some integrated circuit (IC) applications.

Most prior art P-channel GaN transistors employ a Schottky junction or PN junction as the gate; however, these transistors have excessive gate leakage current under a negative gate bias.

Li G. et al. in "Polarization-induced GaN on insulator E/D mode p-channel heterostructure FETs," IEEE Electron Device Letters 2013 describe the use of gate insulator in P-channel GaN transistors. The gate leakage current in the described device is low; however, the p-channel field effect transistor (FET) described has a relatively low on/off current ratio of only about $10^3$.

Shatalov M et al. in "GaN/AlGaN p-channel inverted heterostructure JFET," IEEE Electron Device Letters 2002 describe another p-channel FET; however, the described device has a normally-on operation rather than a normally-off operation and has a high gate leakage current at a negative gate bias of less than or equal to −2 volts (V) of negative gate bias.

Zimmermann T et al. in "P-channel InGaN HFET structure based on polarization doping," IEEE Electron Device Letters 2004 describe another p-channel FET; however, the described device also has a normally-on operation and has a high gate leakage current at a negative gate bias of less than or equal to −1V.

Hahn et al. in "P-channel enhancement and depletion mode GaN-based HFETs with quaternary backbarriers," IEEE Transaction on Electron Devices 2013 describe yet another p-channel device; however, the described device has a high gate leakage current at a negative gate bias of less than or equal to −3V.

What is needed is a p-channel device that has a normally off operation and that has low gate leakage current and a high on/off current ratio. The embodiments of the present disclosure answer these and other needs.

SUMMARY

In a first embodiment disclosed herein, a field effect transistor (FET) comprises a III-Nitride channel layer; a III-Nitride doped cap layer on the channel layer; a source electrode in contact with the III-Nitride cap layer; a drain electrode in contact with the III-Nitride cap layer; a gate electrode located between the source and the drain electrodes; and a gate dielectric layer between the gate electrode and the III-Nitride undoped channel layer; wherein the cap layer is doped to provide mobile holes; and wherein the gate dielectric layer comprises a layer of AlN in contact with the channel layer.

In another embodiment disclosed herein, a method of fabricating a normally off p-channel field effect transistor (FET) comprises providing a substrate; forming a buffer layer on the substrate; forming a III-Nitride channel layer on the buffer layer; forming a III-Nitride doped cap layer on the channel layer; forming a trench through the cap layer in a gate area, the trench extending to a surface of the channel layer or within the channel layer; forming a gate dielectric layer on a bottom and sides of the trench and over the cap layer; etching holes through the gate dielectric layer for a source electrode and a drain electrode; forming a source electrode and a drain electrode in the holes, wherein the source and drain electrodes contact the cap layer; and forming a gate electrode, the gate electrode filling the trench over the gate dielectric layer; wherein the cap layer is doped to provide mobile holes; and wherein the gate dielectric layer comprises a layer of AlN in contact with the channel layer.

In yet another embodiment disclosed herein, a field effect transistor (FET) comprises a substrate, a buffer layer on the substrate; a first undoped GaN layer on the buffer layer; an undoped AlGaN layer on the first undoped GaN layer, a second undoped GaN layer on the undoped AlGaN layer, a source electrode in contact with the second GaN layer, a drain electrode in contact with the second GaN layer, a gate electrode located between the source and the drain electrodes, and a gate dielectric layer between the gate electrode and the second GaN layer, wherein the AlGaN layer facilitates the accumulation of holes at an interface between the second GaN layer and the AlGaN layer due to polarization effects, and wherein the first undoped GaN layer separates the second GaN layer from the buffer layer.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1:
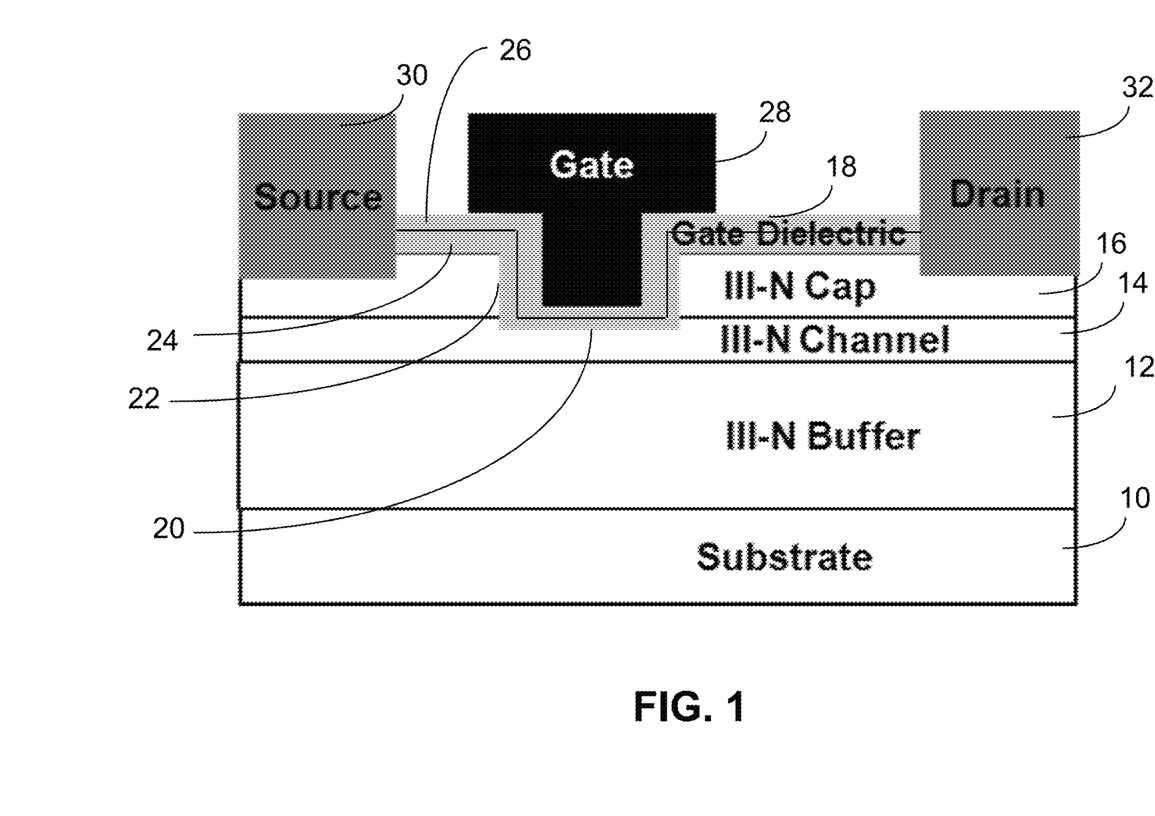
FIG. 1 shows an elevation sectional view of a p-channel FET in accordance with the present disclosure.

FIG. 1 shows an elevation sectional view of a p-channel FET in accordance with the present disclosure. The substrate 10 may be GaN, or may be any other suitable substrate material such as AlN, Sapphire, SiC, and Si. A III-Nitride buffer layer 12 may be grown on the substrate 10 by metal organic chemical vapor deposition (MOCVD) or by molecular beam epitaxy (MBE). The buffer layer 12 may be a stack of III-Nitride layers and may be AlN, GaN, InN, or their alloys. A III-Nitride channel layer 14 is grown on top of the buffer layer 12 and may be AlN, GaN, InN or their alloys. A doped III-Nitride cap layer 16 is grown on top of the channel layer 14, and is doped to provide mobile holes. The III-Nitride cap layer 16 may be doped with Magnesium (Mg). In one embodiment the cap layer 16 may be a 50 nanometers (nm) thick GaN film doped with Mg. The channel layer 14 may be undoped or have a doping that is less than the doping in the cap layer 16.

A gate trench is etched through the cap layer 16, and extends to the surface of the channel layer 14 or within the channel layer 14. A gate dielectric 18 covers the bottom 20 of the trench and the sidewalls 22 of the trench, and may extend over the III-Nitride cap layer 16 and cover the cap layer 16 between the gate 28 and the source 30 and the drain 32. The gate dielectric 18 may be a stack consisting of a layer 24 of AlN and a layer 26 of SiN, with the AlN layer 24 in direct contact with the III-N channel layer 14 at the bottom 20 and on the sidewalls 22 of the trench. The SiN layer 26 is over the AlN layer 24.

A gate electrode 28 is formed by filling the trench with metal on top of the gate dielectric 18. Holes are formed through the gate dielectric 18 for a source electrode 30 and a drain electrode 32 on opposite sides of the gate electrode 28. The source electrode 30 and the drain electrode 32 may be in contact with the III-Nitride cap layer 16, or be in contact with the III-Nitride cap layer 16 and the channel layer 14. The source and drain electrodes 30 and 32 are typically made of a Ni/Au stack and subjected to annealing at 400 C to 600 C for at least 1 minute.

Plasma dry etching may be used to remove the gate dielectric 18 to form the holes for the source and drain electrodes 30 and 32.

Figure 2:
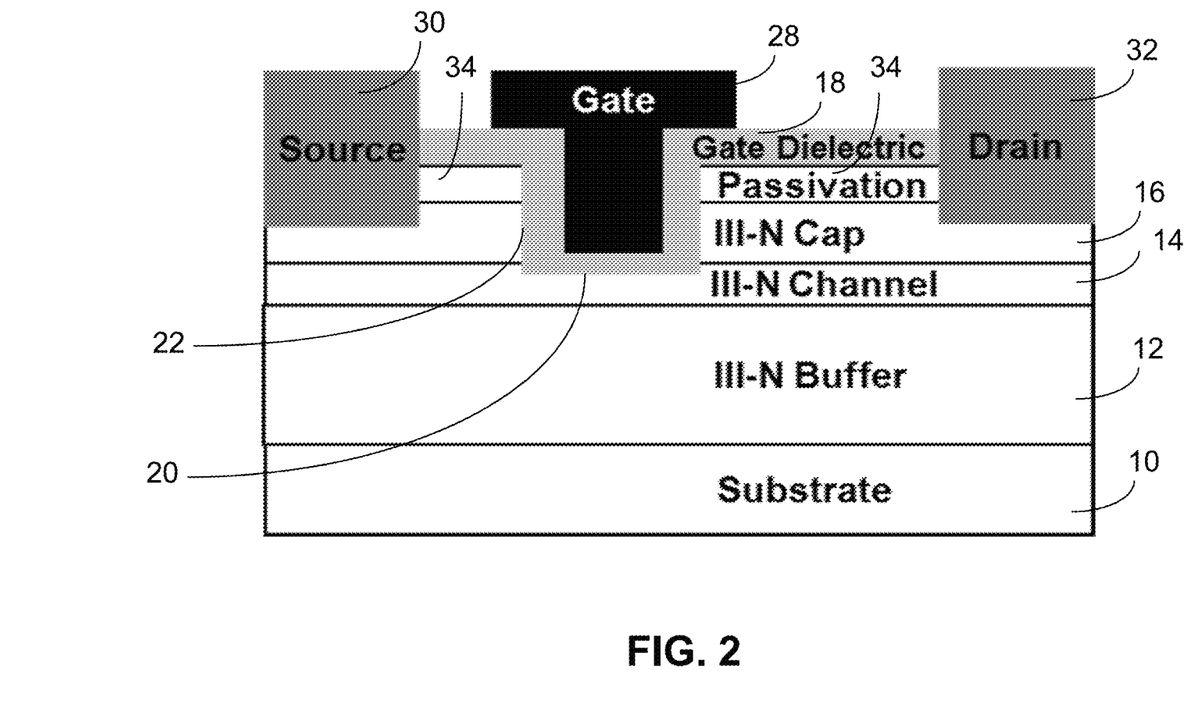
FIG. 2 shows an elevation sectional view of another p-channel FET in accordance with the present disclosure.

FIG. 2 shows an elevation sectional view of another p-channel FET in accordance with the present disclosure. In the process described in reference to FIG. 1, the plasma dry etch may damage the III-Nitride cap layer 16, which would result in a degradation of the source 30 and drain 32 contact resistance. This is avoided in the device structure shown in FIG. 2.

FIG. 2 is the same as FIG. 1 except that a passivation layer 34 is grown on the III-Nitride cap layer 16, and the gate dielectric layer 18 is grown on the passivation layer 34. As described with reference to FIG. 1, the gate dielectric 18 may be a stack consisting of a layer 24 of AlN and a layer 26 of SiN, with the AlN layer 24 in direct contact with the III-N channel layer 14 at the bottom 20 and on the sidewalls 22 of the trench, and the SiN layer 26 over the AlN layer 24.

The passivation layer 34 may be a $SiO_2$ layer deposited by plasma enhanced chemical vapor deposition (PECVD). When etching the holes for the source 30 and drain 32 electrodes, the plasma etch of the gate dielectric layer 18 stops on or within the passivation layer 34, which prevents damage to the underneath III-Nitride cap layer 16. After the gate dielectric etching, the passivation layer 34 may be removed by wet etching so that the source and drain electrodes make contact with the III-Nitride cap layer 16. A HF-based chemistry may be used for the wet etch for a $SiO_2$ passivation layer 34. A wet etch does not cause any damage to the III-Nitride cap layer 16.

Figure 3:
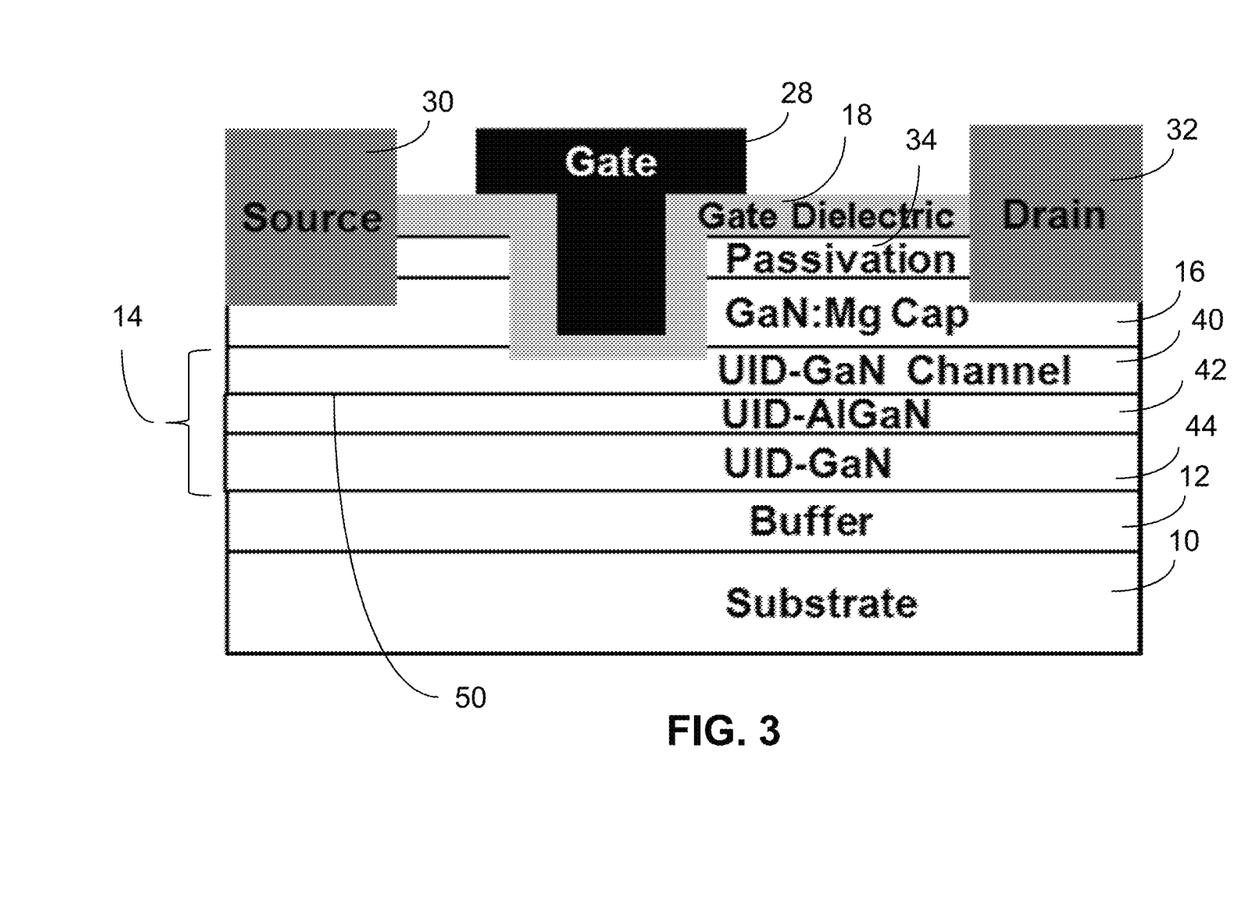
FIG. 3 shows an elevation sectional view of yet another p-channel FET in accordance with the present disclosure.

As shown in FIG. 3, the channel layer 14 may include a 20 nm thick undoped GaN film or layer 40, a 35 nm thick undoped AlGaN layer 42 with 25% Al composition located under the undoped GaN layer 40, and a 500-nm-thick undoped GaN layer 44 located below the AlGaN layer 42. The AlGaN layer 42 facilitates the accumulation of holes at the interface 50 between the GaN layer 40 and the AlGaN layer 42, due to polarization effects. The thick undoped GaN layer 44 separates the GaN layer 40 far away from the buffer layer 12, which generally has defects. As described above, the buffer layer 12 may be made of a stack of AlN, GaN, InN, or their alloys, such as AlGaN, and is located under the undoped GaN layer 44.

In the embodiment of FIG. 3, a cap layer 16 may be optionally grown on the GaN layer 40. If the cap layer 16 is not formed on the GaN layer 40, then the passivation layer 34 is formed on the GaN layer 40. Then the gate dielectric 18 is formed in the trench and on the passivation layer 34. The next steps of etching to provide holes in the gate dielectric 18 and the passivation layer 34, and forming the source 30, drain 32 and gate 28 electrodes are as described above. If the cap layer 16 is formed on the GaN layer 40, then the source 30 and drain 32 electrodes are formed in contact with the cap layer 16. If the cap layer 16 is not formed on the GaN layer 40, then the source 30 and drain 32 electrodes are formed in contact with the GaN layer 40.

Figure 4:
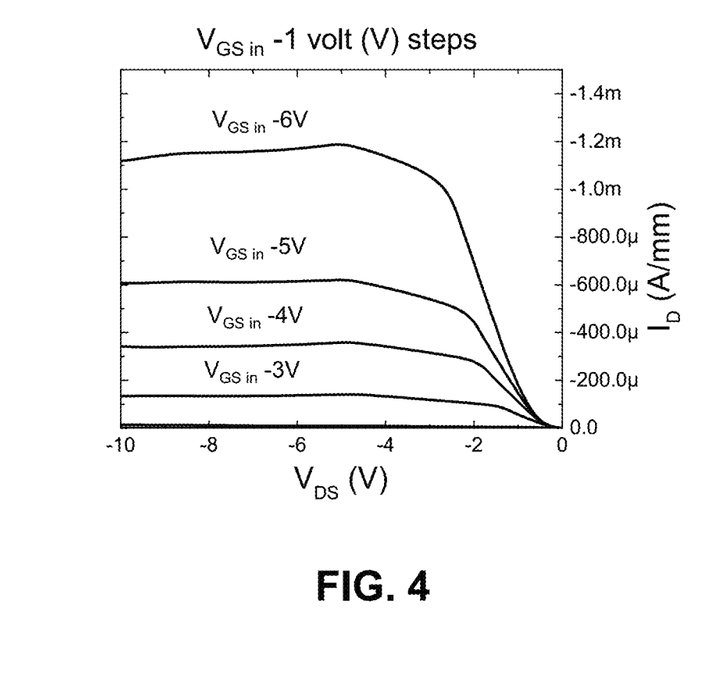
FIG. 4 shows a graph of measured output current voltage (IV) characteristics for a p-channel FET fabricated in accordance with the present disclosure.
Figure 5:
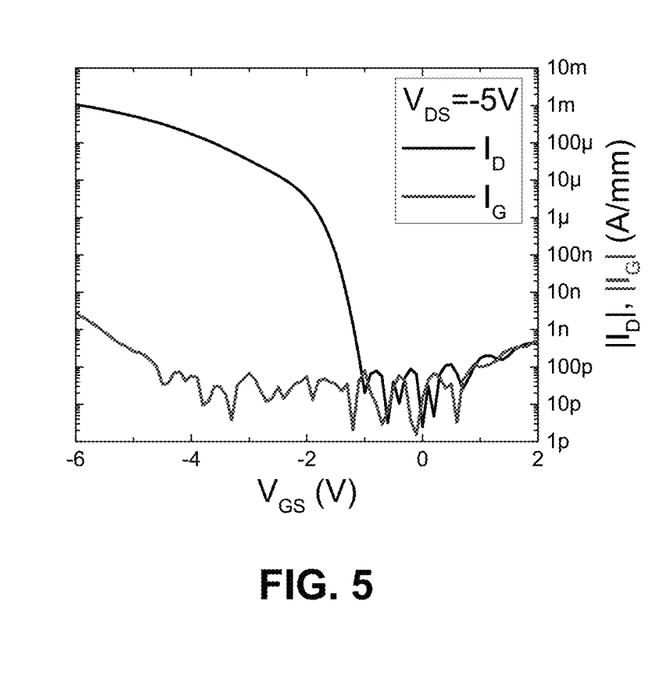
FIG. 5 shows a graph of measured input current voltage (IV) characteristics for a p-channel FET fabricated in accordance with the present disclosure.

FIG. 4 shows the measured output current voltage (IV) characteristics of a p-channel FET fabricated in accordance with FIG. 3. FIG. 5 shows the measured input current voltage (IV) characteristics of the p-channel FET fabricated in accordance with FIG. 3.

The measurement data in the graphs of FIGS. 4 and 5 show that the p-channel FET device has desirable features. The p-channel FET device has a normally-off operation with a threshold voltage of −2V, a high on/off drain current ratio of $>10^6$, and a very low leakage current of less than 10 nA/mm.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . .X"

Concepts

At least the following concepts have been disclosed.

Concept 1. A field effect transistor (FET) comprising:
  a III-Nitride channel layer;
  a III-Nitride doped cap layer on the channel layer;
  a source electrode in contact with the III-Nitride cap layer;
  a drain electrode in contact with the III-Nitride cap layer;
  a gate electrode located between the source and the drain electrodes; and
  a gate dielectric layer between the gate electrode and the III-Nitride channel layer;
  wherein the cap layer is doped to provide mobile holes; and
  wherein the gate dielectric layer comprises a layer of AlN in contact with the channel layer.

Concept 2. The FET of concept 1 wherein the gate dielectric layer comprises:
  the AlN layer in contact with the channel layer; and
  a SiN layer on the AlN layer.

Concept 3. The FET of concept 1 further comprising:
  a substrate;
  a buffer layer on the substrate, the buffer layer between the channel layer and the substrate.

Concept 4. The FET of concept 1 wherein:
  the gate dielectric layer is on a bottom and sides of a trench extending through the cap layer.

Concept 5. The FET of concept 1:
  wherein the gate dielectric layer extends between the gate electrode and the source electrode and between the gate electrode and the drain electrode; and
  wherein the gate dielectric layer is over the cap layer.

Concept 6. The FET of concept 5 further comprising a passivation layer between the gate dielectric layer and the cap layer.

Concept 7. The FET of concept 6 wherein the passivation layer comprises $SiO_2$.

Concept 8. The FET of concept 1 wherein the cap layer is doped with Mg to provide mobile holes.

Concept 9. The FET of concept 1 wherein the cap layer comprises a GaN layer doped to provide mobile holes.

Concept 10. The FET of concept 1 wherein the channel layer is undoped or is doped with a doping less than the doping of the III-Nitride doped cap layer.

Concept 11. The FET of concept 3 wherein:
  the substrate comprises GaN, AlN, Sapphire, SiC or Si;
  the buffer layer comprises AlN, GaN, InN or any alloy of AlN, GaN and InN; and
  the channel layer comprises AlN, GaN, InN or any alloy of AlN, GaN and InN.

Concept 12. The FET of concept 1 wherein the channel layer comprises:
  a first undoped GaN layer on the buffer layer;
  an undoped AlGaN layer on the first undoped GaN layer; and
  a second undoped GaN layer on the undoped AlGaN layer;
  wherein the AlGaN layer facilitates the accumulation of holes at an interface between the second GaN layer and the AlGaN layer due to polarization effects; and
  wherein the first undoped GaN layer separates the second GaN layer from the buffer layer.

Concept 13. The FET of concept 12 wherein:
  the first updoped GaN layer is 500 nm thick;
  the AlGaN layer is 35 nm thick and has a 25% Al composition;
  the second updoped GaN layer is 20 nm thick; and
  the cap layer is 50 nm thick GaN.

Concept 14. A method of fabricating a normally off p-channel field effect transistor (FET) comprising:
  providing a substrate;
  forming a buffer layer on the substrate;
  forming a III-Nitride channel layer on the buffer layer;
  forming a trench in a gate area, the trench extending to a surface of the channel layer or within the channel layer;
  forming a gate dielectric layer on a bottom and sides of the trench and over the channel layer;
  etching holes through the gate dielectric layer for a source electrode and a drain electrode;
  forming a source electrode and a drain electrode in the holes, wherein the source and drain electrodes contact the channel layer; and
  forming a gate electrode, the gate electrode filling the trench over the gate dielectric layer;
  wherein the gate dielectric layer comprises a layer of AlN in contact with the channel layer.

Concept 15. The method of concept 14 wherein forming the gate dielectric layer comprises:
  forming the AlN layer in contact with the channel layer at the bottom of the trench; and
  forming a SiN layer on the AlN layer.

Concept 16. The method of concept 14 further comprising:
  forming a III-Nitride doped cap layer on the channel layer; and
  forming a passivation layer over the cap layer;
  wherein the cap layer is doped to provide mobile holes; and
  wherein the passivation layer is between the cap layer and the gate dielectric layer.

Concept 17. The method of concept 16 wherein forming the passivation layer comprises depositing $SiO_2$ using plasma enhanced chemical vapor deposition (PECVD).

Concept 18. The method of concept 14 wherein forming the cap layer comprises doping the cap layer with Mg to provide mobile holes.

Concept 19. The method of concept 14 wherein forming the cap layer comprises forming a GaN layer doped to provide mobile holes.

Concept 20. The method of concept 16 wherein etching holes through the gate dielectric layer for a source electrode and a drain electrode comprises:
  using plasma dry etching to remove the gate dielectric layer, wherein the plasma dry etch stops at the passivation layer; and
  using wet etch to remove the passivation layer to expose the contact layer for contact with the source and drain electrodes.

Concept 21. The method of concept 14 wherein:
  the substrate comprises GaN, AlN, Sapphire, SiC or Si;
  the buffer layer comprises AlN, GaN, InN or any alloy of AlN, GaN and InN; and the channel layer comprises AlN, GaN, InN or any alloy of AlN, GaN and InN.

Concept 22. The method of concept 14 wherein forming the channel layer comprises:
  forming a first undoped GaN layer on the buffer layer;
  forming an undoped AlGaN layer on the first undoped GaN layer; and
  forming a second undoped GaN layer on the undoped AlGaN layer;
  wherein the AlGaN layer facilitates the accumulation of holes at an interface between the second GaN layer and the AlGaN layer due to polarization effects; and
  wherein the first undoped GaN layer separates the second GaN layer from the buffer layer.

Concept 23. The method of concept 22 wherein:
  the first updoped GaN layer is 500 nm thick;
  the AlGaN layer is 35 nm thick and has a 25% Al composition;
  the second updoped GaN layer is 20 nm thick; and
  the cap layer is 50 nm thick GaN.

Concept 24. The method of concept 14 wherein the channel layer is undoped or is doped with a doping less than the doping of the III-Nitride doped cap layer.

Concept 25. A field effect transistor (FET) comprising:
  a substrate;
  a buffer layer on the substrate;
  a first undoped GaN layer on the buffer layer;
  an undoped AlGaN layer on the first undoped GaN layer;
  a second undoped GaN layer on the undoped AlGaN layer;
  a source electrode in contact with the second GaN layer;
  a drain electrode in contact with the second GaN layer;
  a gate electrode located between the source and the drain electrodes; and
  a gate dielectric layer between the gate electrode and the second GaN layer;
  wherein the AlGaN layer facilitates the accumulation of holes at an interface between the second GaN layer and the AlGaN layer due to polarization effects; and
  wherein the first undoped GaN layer separates the second GaN layer from the buffer layer.

Concept 26. The FET of concept 25 further comprising a passivation layer between the gate dielectric layer and the second GaN layer.

Concept 27. The FET of concept 26 wherein the passivation layer comprises $SiO_2$.

Concept 28. The FET of concept 26 wherein:
  the gate dielectric layer is on a bottom and sides of a trench extending through the passivation layer.

Concept 29. The FET of concept 25 wherein the gate dielectric layer comprises:
  the AlN layer in contact with the channel layer; and
  a SiN layer on the AlN layer.

Concept 30. The FET of concept 25 further comprising:
  a cap layer between the second GaN layer and the gate dielectric;
  wherein the cap layer is doped to provide mobile holes.

Concept 31. The FET of concept 25 wherein:
  the undoped AlGaN layer has a 25% Al composition.

Concept 32. The FET of concept 30 wherein:
  the substrate comprises GaN, AlN, Sapphire, SiC or Si;
  the buffer layer comprises AlN, GaN, InN or any alloy of AlN, GaN and InN; and
  the cap layer comprises GaN doped with Mg.

What is claimed is:

1. A field effect transistor (FET) comprising:
  a group III-Nitride channel layer;
  a group III-Nitride doped cap layer on the channel layer, wherein the cap layer consists of a single layer comprising doping to provide mobile holes;
  a source electrode in direct contact with the group III-Nitride cap layer;
  a drain electrode in direct contact with the group III-Nitride cap layer;
  a gate electrode located between the source and the drain electrodes; and
  a gate dielectric layer between the gate electrode and the group III-Nitride channel layer;
  wherein the FET is a normally off FET.

2. The FET of claim 1 wherein the gate dielectric layer comprises:
  the AlN layer in contact with the channel layer; and
  a SiN layer on the AlN layer.

3. The FET of claim 1 further comprising:
  a substrate;
  a buffer layer on the substrate, the buffer layer between the channel layer and the substrate.

4. The FET of claim 3 wherein:
  the substrate comprises GaN, AlN, Sapphire, SiC or Si;
  the buffer layer comprises AlN, GaN, InN or any alloy of AlN, GaN and InN; and
  the channel layer comprises AlN, GaN, InN or any alloy of AlN, GaN and InN.

5. The FET of claim 1 wherein:
  the gate dielectric layer is on a bottom and sides of a trench extending through the cap layer.

6. The FET of claim 1:
  wherein the gate dielectric layer extends between the gate electrode and the source electrode and between the gate electrode and the drain electrode; and
  wherein the gate dielectric layer is over the cap layer.

7. The FET of claim 6 further comprising a passivation layer between the gate dielectric layer and the cap layer.

8. The FET of claim 7 wherein the passivation layer comprises $SiO_2$.

9. The FET of claim 1 wherein the cap layer is doped with Mg to provide mobile holes.

10. The FET of claim 1 wherein the cap layer comprises a GaN layer doped to provide mobile holes.

11. The FET of claim 1 wherein the channel layer is undoped or is doped with a doping less than the doping of the group III-Nitride doped cap layer.

12. The FET of claim 1 wherein the channel layer comprises:
  a first undoped GaN layer on the buffer layer;
  an undoped AlGaN layer on the first undoped GaN layer; and
  a second undoped GaN layer on the undoped AlGaN layer;
  wherein the AlGaN layer facilitates the accumulation of holes at an interface between the second GaN layer and the AlGaN layer due to polarization effects; and
  wherein the first undoped GaN layer separates the second GaN layer from the buffer layer.

13. The FET of claim 12 wherein:
  the first updoped GaN layer is 500 nm thick;
  the AlGaN layer is 35 nm thick and has a 25% Al composition;
  the second updoped GaN layer is 20 nm thick; and
  the cap layer is 50 nm thick GaN.

14. The FET of claim 1 wherein the gate dielectric layer comprises a layer of AlN in contact with the channel layer.

15. A method of fabricating field effect transistor (FET) comprising:

providing a substrate;

forming a buffer layer on the substrate;

forming a group III-Nitride channel layer on the buffer layer;

forming a group III-Nitride doped cap layer on the channel layer, wherein the cap layer consists of a single layer comprising doping to provide mobile holes;

forming a trench in a gate area, the trench extending to a surface of the channel layer or within the channel layer;

forming a gate dielectric layer on a bottom and sides of the trench and over the cap layer;

etching through the gate dielectric layer to form a first hole in the gate dielectric layer for a source electrode and a second hole in the gate dielectric layer for a drain electrode;

forming the source electrode in the first hole, wherein the source electrode is in direct contact with the cap layer;

forming the drain electrode in the second hole, wherein the drain electrode is in direct contact with the cap layer; and forming a gate electrode, the gate electrode filling the trench over the gate dielectric layer;

wherein the field effect transistor is a normally off p-channel field effect transistor.

16. The method of claim 15 wherein forming the gate dielectric layer comprises:

forming the AlN layer in contact with the channel layer at the bottom of the trench; and forming a SiN layer on the AlN layer.

17. The method of claim 15 further comprising:

forming a passivation layer over the cap layer;

wherein the passivation layer is between the cap layer and the gate dielectric layer.

18. The method of claim 17 wherein forming the passivation layer comprises depositing $SiO_2$ using plasma enhanced chemical vapor deposition (PECVD).

19. The method of claim 15 wherein forming the cap layer comprises doping the cap layer with Mg to provide mobile holes.

20. The method of claim 15 wherein forming the cap layer comprises forming a GaN layer doped to provide mobile holes.

21. The method of claim 15 wherein the gate dielectric layer comprises a layer of AlN in contact with the channel layer.

22. A field effect transistor (FET) comprising:

a substrate;

a buffer layer on the substrate;

a first undoped GaN layer on the buffer layer;

an undoped AlGaN layer on the first undoped GaN layer;

a second undoped GaN layer on the undoped AlGaN layer;

a group III-Nitride doped cap layer on the second undoped GaN layer, wherein the cap layer consists of a single layer comprising doping to provide mobile holes;

a source electrode in direct contact with the cap layer;

a drain electrode in direct contact with the cap layer;

a gate electrode located between the source and the drain electrodes; and a gate dielectric layer between the gate electrode and the second GaN layer;

wherein the AlGaN layer facilitates the accumulation of holes at an interface between the second GaN layer and the AlGaN layer due to polarization effects;

wherein the first undoped GaN layer separates the second GaN layer from the buffer layer; and wherein the FET is a normally off p-channel FET.

23. The FET of claim 22 wherein the gate dielectric layer comprises a layer of AlN in contact with the channel layer.

24. The FET of claim 22 further comprising a passivation layer between the gate dielectric layer and the cap layer.

* * * * *